(12) United States Patent
Sengodan

(10) Patent No.: US 10,827,585 B1
(45) Date of Patent: Nov. 3, 2020

(54) DRIVING LIGHT EMITTING DIODES AND DISPLAY APPARATUS

(71) Applicant: GOODRICH LIGHTING SYSTEMS, INC., Oldsmar, FL (US)

(72) Inventor: Rajkumar Sengodan, Tamilnadu (IN)

(73) Assignee: GOODRICH LIGHTING SYSTEMS, INC., Oldsmar, FL (US)

( * ) Notice: Subject to any disclaimer, the term of this patent is extended or adjusted under 35 U.S.C. 154(b) by 0 days.

(21) Appl. No.: 16/444,127

(22) Filed: Jun. 18, 2019

(30) Foreign Application Priority Data

Apr. 17, 2019 (IN) .............................. 201911015459

(51) Int. Cl.
| H05B 45/37 | (2020.01) |
| F21V 23/00 | (2015.01) |
| F21V 23/02 | (2006.01) |
| H03K 19/20 | (2006.01) |

(52) U.S. Cl.
CPC ........... *H05B 45/37* (2020.01); *F21V 23/007* (2013.01); *F21V 23/023* (2013.01); *H03K 19/20* (2013.01)

(58) Field of Classification Search
None
See application file for complete search history.

(56) References Cited

U.S. PATENT DOCUMENTS

| 5,812,012 | A | 9/1998 | Jebens |
| 7,295,176 | B2 | 11/2007 | Yang |
| 7,777,702 | B2 | 8/2010 | Reuter |
| 9,769,890 | B1 | 9/2017 | Xiong et al. |
| 2010/0013395 | A1 | 1/2010 | Archibald et al. |
| 2010/0052552 | A1 | 3/2010 | Kimura |
| 2010/0220049 | A1 | 9/2010 | Murakami |
| 2013/0057462 | A1 | 3/2013 | Yang et al. |
| 2014/0328090 | A1* | 11/2014 | Takahashi ......... H02M 3/33576 363/21.17 |
| 2015/0256071 | A1 | 9/2015 | Penzo et al. |
| 2016/0226395 | A1* | 8/2016 | Palmer ................ H02M 1/4208 |
| 2017/0265261 | A1 | 9/2017 | Li et al. |

OTHER PUBLICATIONS

European Search Report; European Application No. 19211764.6, filed Nov. 27, 2019; dated May 4, 2020; 11 pages.

* cited by examiner

*Primary Examiner* — Amy Cohen Johnson
*Assistant Examiner* — Jianzi Chen
(74) *Attorney, Agent, or Firm* — Cantor Colburn LLP

(57) ABSTRACT

Systems and methods for operating light emitting diodes (LEDs) circuits are provided. Aspects include a power supply coupled to the first node, a set of light emitting diodes (LEDs) arranged in series between a second node and a third node, a boost converter coupled to the first node and the second node, a first control circuit configured to operate a first switching element to control operation of the boost convertor, wherein the boost convertor outputs a step-up voltage to drive the set of LEDs, and a second control circuit to operate the second switching element to control operation of the set of LEDs, the second switching element coupled to the third node, wherein the set of LEDs are ON responsive to the second switching element being in an ON state.

18 Claims, 2 Drawing Sheets

DRIVING LIGHT EMITTING DIODES AND DISPLAY APPARATUS

CROSS-REFERENCE TO RELATED APPLICATIONS

This application claims the benefit of Indian provisional application no. 201911015459 filed Apr. 17, 2019, which is incorporated herein by reference in its entirety.

BACKGROUND

The present invention generally relates to light emitting diodes (LEDs), and more specifically, to circuit and method for driving LEDs and display apparatus.

A light-emitting diode (LED) circuit (also referred to as an LED driver) is an electrical circuit used for an LED. The circuit provides sufficient current to light the LED at the required brightness, while also limiting the current to prevent damaging the LED.

The voltage drop across an LED is approximately constant over a wide range of operating current; therefore, a small increase in applied voltage greatly increases the current. Very simple circuits are used for low-power indicator LEDs. More complex, current source circuits are required when driving high-power LEDs for illumination to achieve correct current regulation. LED driving circuits can faces voltage losses that occur when discharge models are discharging the residue power during LED power off cycle which can cause issues in power sensitive applications for LEDs such as LED drivers, displays and low power electronic devices in aircraft systems, automobiles, and consumer electronics.

SUMMARY

Embodiments of the present invention are directed to system. A non-limiting example of the system includes a power supply coupled to the first node, a set of LEDs arranged in series between a second node and a third node, a boost converter coupled to the first node and the second node, a first control circuit configured to operate a first switching element to control operation of the boost convertor, wherein the boost convertor outputs a step-up voltage to drive the set of LEDs, and a second control circuit to operate the second switching element to control operation of the set of LEDs, the second switching element coupled to the third node, wherein the set of LEDs are ON responsive to the second switching element being in an ON state.

Embodiments of the present invention are directed to a method for operating an LED circuit. A non-limiting example of the method includes operating a first switching element to control a boost convertor in the LED driver circuit, wherein the boost convertor is in an ON state responsive to the first switching element being in an ON state, and wherein the boost convertor outputs a step-up voltage to drive a set of LEDs and operating a second switching element to control the set of LEDs in the LED driver circuit, wherein the set of LEDs are in an ON state responsive to the second switching element being in an ON state.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
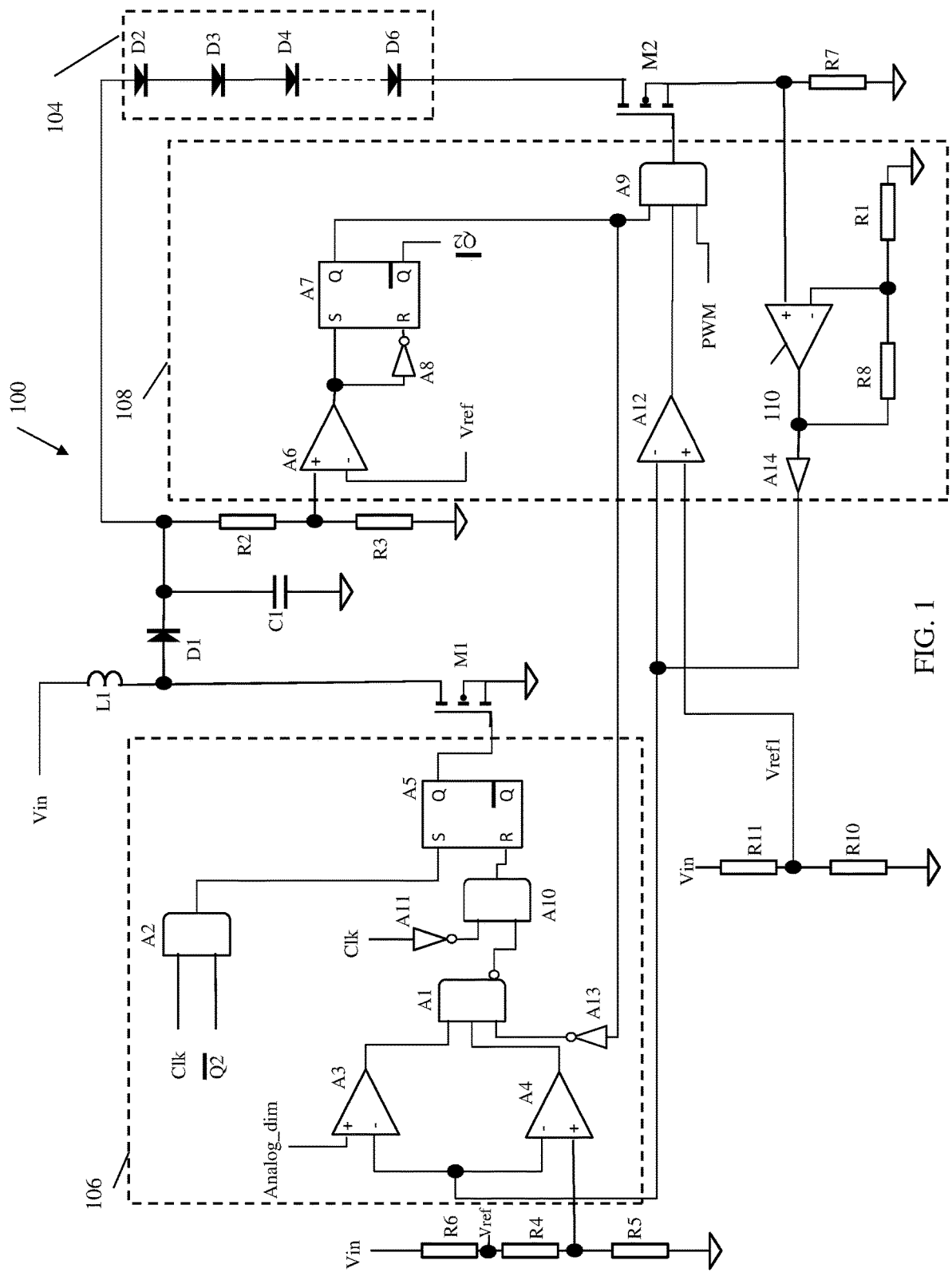
FIG. 1 depicts a block diagram of a circuit topology driving a set of light emitting diodes according to one or more embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e.

two, three, four, five, etc. The term "connection" may include both an indirect "connection" and a direct "connection."

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, LEDs can be utilized in many power sensitive applications such as, for example, displays and low power electronic devices in aircraft lighting systems, aircraft interiors, aircraft display, landing lights, strobe lights for flashing emergency needs, automobiles, and commercial uses. However, as mentioned above, conventional LED discharge models for discharging the residue power during LED power off cycles can suffer losses. For driving high-power or low-power LEDs, the driving circuit utilizes an inductor/transformer to provide step-up voltage which in turn increases power loss if a discharging circuit is deployed for removing excess power during LED off cycle.

The above-described aspects of the invention address the shortcomings of the prior art by providing an LED driving circuit that can be configured in energy efficient LED applications where power conservation is needed. The present driving circuit can solve the issue with dissipating surplus charges in the output capacitor by implementing digital logic blocks to detect and power ON/OFF LED arrays. In this way, the power dissipation in the discharge module can be ignored.

FIG. 1 depicts a block diagram of a circuit topology for an LED drive circuit with digital control loop topology according to one or more embodiments. The circuit topology 100 includes a variety of electronic components that drive a set of LEDs 104. The switching control unit 102 (sometimes referred to as "controller") can evaluate the magnitude of the current flowing on the set of LEDs 104, and adjust the magnitude of the LED current by comparing it with the threshold voltage capable of being reset or adjusted and outputting a signal to turn on or off the switching unit so that the LED current can maintain the current value around a first threshold. To maintain flicker free LED operation, the LED ON/OFF sequence is operated to be above 200 Hz.

In one or more embodiments, the controller 102 is configured to control two control loops sections of the circuit topology 100. The first control loop 106 includes two comparators A3, A4, one NAND gate A1, two AND gates A2, A10, two inverters A11, A13, an oscillator (labeled as "Clk" in FIG. 1 and sometimes referred to as "clock"), and an S-R flip flop A5. The second control loop 108 includes comparator A6, one buffer A14, one AND gate A9, two inverters A8, comparator A12, one signal amplifier 110, and an S-R flip flop A7.

In one or more embodiments, in first control loop 106, the two comparators A3, A4, and a voltage across a resistor of the current detecting unit is applied to each inverting input terminal. A reference voltage (i.e., the voltage across resister R5) is applied to a non-inverting input terminal of comparator A4. When the voltage across the resister of the current detecting unit R7 (i.e., the voltage corresponding to the set of LEDs 104 current), is higher than the reference voltage across R5, the comparator A4 outputs a logic LOW signal.

In some embodiments, the reference voltage across R5 is determined with the consideration of the maximum rated current and resistance value of the set of LEDs 104. An analog dimming voltage (Analog_dim) is applied to the non-inverting input terminal of the comparator A3. This external applied voltage (Analog_dim) should be less than the voltage corresponding to the maximum rated current for the set of LEDs 104, however the externally applied voltage corresponds to the current determined not to exceed the LED current. The logic output signals from the two comparators A3 and A4 are applied to the NAND gate A1 input along with Q2 from S-R flip-flop A7. The output of the NAND gate A1 is fed in to an input of AND gate A10 which also has an inverted clock (clk) input. The inverted clock input is achieved utilizing inverter A11 with the clk signal as an input and the inverted clk signal being the output of the inverter A11 as an input to AND gate A10. The output of AND gate A10 is the input to the RESET input of the S-R flip-flop A5. An output signal of the oscillator (clk) is input into AND gate A2 along with Q2 (bar) which is the inverted output Q2 from S-R flip-flop A7. The output of AND gate A2 is input to a SET input of the S-R flip flop A5. The oscillator (clk) outputs a pulse signal of a pre-determined frequency. In one or more embodiments, the two comparators A3, A4 can be replaced with operational amplifiers (Op-amp).

In one or more embodiments, the first control loops 106 can be operated where the output signal of the oscillator (clk) is a logic high signal, the S-R flip-flop A5 outputs a corresponding logic HIGH signal as Q2(bar) is set to logic '1', and maintains this logic '1'. When the output signal of AND gate A10 is a logic HIGH signal, the S-R flip-flow A5 outputs a logic LOW signal. That is to say, the S-R flip flop A5 outputs a logic LOW signal when the voltage corresponding to the LED current is higher than the reference voltage Vref and voltage across R5, but it the S-R flip-flop A5 outputs logic HIGH signals in the other case. Therefore, the switching frequency adjusts the magnitude of the LED current by outputting a signal to turn ON or OFF so that the LED current can maintain a predetermined peak value within the limitation that it does not exceed the maximum rated current.

In one or more embodiments, the second control loop 108 utilizing a comparator A6 where a reference voltage Vref is applied to an inverting input terminal of comparator A6. When the voltage across the resister of the voltage detecting unit R3 (i.e, the voltage corresponding to the LED input voltage is higher than the reference voltage Vref), the comparator A6 outputs a logic HIGH signal. The reference voltage Vref is determined with consideration of the peak working voltage for the set of LEDs 104. The voltage across resistor R3 of the voltage detecting unit is applied to non-inverting terminal in comparator A6 and the comparator A6 output is an input to the SET input of S-R flip-flop A7 and an input to invertor A8 which is fed to the RESET input of the S-R flip-flop. The logic output signals from the comparator A6 is applied to the SET input of the S-R flip-flop A7. The logic inverted output signals from the comparator A6 is applied to the RESET input of the S-R flip-flop A7. The output signals are inverted by inverter A8 and input in to the RESET input. An output signal of the S-R flip-flop A7 is input to the AND gate A9 along with a pulse width modulated (PWM) input applied to an input of the AND gate A9. The output of A9 is applied to switching element M2 for controlling the LED current. A non-inverting amplifier 110 is utilized to amplify the weak signal across sense resisters for logic operation and A14 is a buffer circuit.

In one or more embodiments, the first control loop 106 and second control loop 108 are loop backed to control the input switch based on output drive. The equivalent voltage for the LED current and the S-R flip-flop output is feedback to the first control loop 106 in order to have stable sequential control.

In one or more embodiments, when comparator A6 non-inverting input terminal goes high then the comparator A6 outputs logic HIGH. The comparator A6 sets S-R flip-flop A7 output to HIGH. Depending on the PWM duty cycle, the AND gate A9 will turn ON the switching element M2. In one or more embodiments, the switching element M2 is a metal-oxide semiconductor field effect transistor (MOSFET). In some embodiments, the switching element M2 is a NMOS type. For verification, the PWM is kept at a maximum duty cycle. Therefore, the LED current starts to flow which effectively develops the voltage across the sense resistor R7. This voltage is of a small value (around 150 mV) and it is amplified by amplifier 110 and buffered by buffer circuit A14. This voltage is applied to the inverting input terminals for comparators A3, A4 and as an input to the inverting input of comparator A12. Comparator A12 receives input Vref1 into the non-inverting input. Vref1 is received from the voltage divider R10, R11 which divides the voltage from the input voltage Vin. When A14 output goes higher than Vref1 then A12 will output logic low and if A14 output is less than Vref1 then A12 will output logic HIGH. In one or more embodiments, when the comparator A6 output logic is HIGH, the output of inverter A8 is LOW. This LOW will reset S-R flip-flop A7 which causes switching element M2 to go to an OFF state. This loop continues until the comparator A6 output goes LOW. When the voltage across R7 (VR7) is high for more than an oscillator (clk) period then comparators A3 and A4 will toggle to logic LOW output. When the voltage across R7 (VR7) is high for more than an oscillator (clk) period then comparators A3 and A4 will toggle to logic LOW output considering VR7 exceeds analog dimming (A3) and operating threshold range (A4). NAND gate A1 will output logic HIGH to AND gate A10. AND gate A10 will enable the RESET input of S-R flip-flop A5.

In one or more embodiments, when comparator A6 is logic LOW, switching element M2 is disabled (or in an OFF state) and the voltage across R7 (VR7) is low, comparators A3 and A4 will have a logic HIGH output. NAND gate A1 will output logic LOW to AND gate A10. AND gate A10 will disable RESET of S-R flip-flop A5. AND gate A2 will enable SET of S-R flip-flop A5 which causes switching element M1 to start switching with respect to the oscillator (or Clock) frequency. The switching element M1 controls the boost convertor circuit that includes inductor L1, diode D1, and capacitor C1. The capacitor C1 steps up the input voltage Vin to drive the set of LEDs 104. L1, D1, M1, C1 together constitute boost converter topology for step-up operation from Vin to a higher voltage. When M1 is ON, current will flow through L1 and inductor L1 stores energy by generating a magnetic field. When M1 is OFF, the magnetic field previously created will be collapsed to transfer energy to the load (LEDs). As a result, two sources (Vin+$V_{L1}$) will be in series causing a higher voltage to charge the capacitor C1 through the diode D1. If M1 switch is operated fast enough, the inductor will not discharge fully in between charging stages, and the voltage across C1 will always hold a voltage greater than that of the input source Vin.

In one or more embodiments, the comparator A6 compares a reference voltage Vref to the voltage across resistor R3 to provide an input to the S-R flip flop A7. When the comparator A6 output is LOW (i.e, when the voltage across R3 is less than the reference voltage Vref), the output of the S-R flip-flop A7 is LOW causing the output of AND gate A9 to be low and thus switching element M2 is in an OFF state. However, when the capacitor C1 is fully charged, the voltage across C1 will be greater than the reference voltage Vref because Vin after voltage division by resistors R2 and R3 is greater than Vref. When capacitor C1 is fully charged, the resulting voltage will cause the output of S-R flip-flop A7 to remain HIGH as an input to AND gate A9. The switching element M2 will be controlled by the PWM signal so when PWM signal is HIGH, M2 will be turned ON and when PWM signal is LOW, M2 will be turned OFF. Also, when the output of S-R flip-flop A7 is HIGH, invertor A13 will provide a LOW input to NAND gate A1.

In one or more embodiments, switching element M1 controls the boost convertor that includes inductor L1, diode D1, and capacitor C1. The boost convertor steps up the input voltage Vin to drive the set of LEDs 104 (D2, D3, D4, D6). While only four diodes in the set of diodes 104 is shown in the illustrative example, any number of diodes can be utilized. The voltage across the capacitor C1 is the voltage step up that is utilized to drive the set of LEDs 104. For example, with an input voltage of Vin=10V and an oscillator (clk) frequency of 50 kHz having a 50% duty cycle. The voltage output of the boost convertor is Vout=25.34V with a peak current of Ipeak=268.80 mA. This is with the inductor L1=20 pH, the capacitor C1=100 µF.

In one or more embodiments, the controller 102 or any of the hardware referenced in the system 200 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

Figure 2:
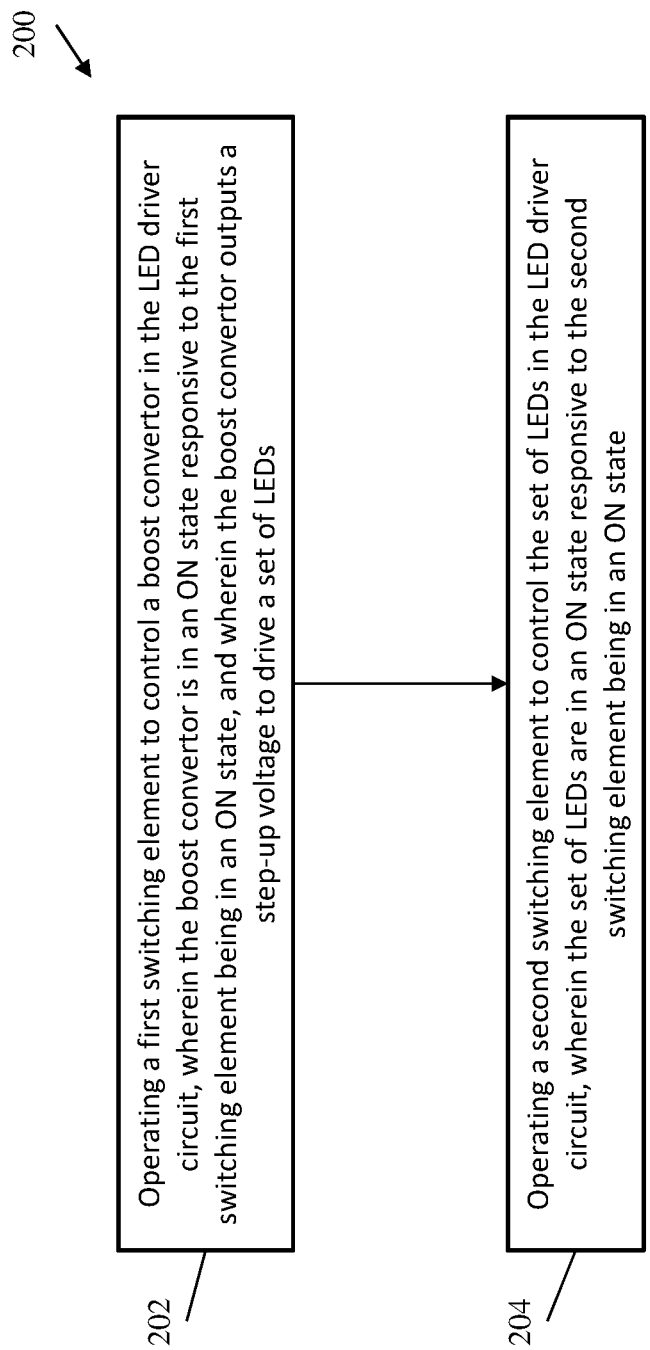
FIG. 2 depicts a block diagram of a operating an LED circuit according to one or more embodiments.

FIG. 2 depicts a block diagram of a method for operating an LED circuit according to one or more embodiments. The method 200 includes operating a first switching element to control a boost convertor in the LED driver circuit, wherein the boost convertor is in an ON state responsive to the first switching element being in an ON state, and wherein the boost convertor outputs a step-up voltage to drive a set of LEDs, as shown in block 202. And at block 204, the method 200 includes operating a second switching element to control the set of LEDs in the LED driver circuit, wherein the set of LEDs are in an ON state responsive to the second switching element being in an ON state.

Additional processes may also be included. It should be understood that the processes depicted in FIG. 2 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
   a power supply coupled to the first node;
   a set of light emitting diodes (LEDs) arranged in series between a second node and a third node;
   a boost converter coupled to the first node and the second node;
   a first control circuit configured to operate a first switching element to control operation of the boost convertor, wherein the boost convertor outputs a step-up voltage to drive the set of LEDs; and
   a second control circuit to operate a second switching element to control operation of the set of LEDs, the second switching element coupled to the third node, wherein the set of LEDs are ON responsive to the second switching element being in an ON state, wherein the second control circuit provides a first feedback signal and a second feedback signal to the first control circuit; and
   wherein the first feedback signal comprises a voltage value corresponding to a voltage across the set of LEDs;
   wherein the first control circuit comprises an S-R flip flop;
   wherein the second control circuit comprises a second S-R flip flop; and
   wherein a SET input of the S-R flip flop is driven by an output of a two input AND gate, wherein a first input of the two input AND gate comprises an oscillator signal, and wherein a second input of the two input AND gate comprises a complimentary output of the second S-R flip flop.

2. The system of claim 1, wherein the first feedback signal further comprises an input to at least one comparator.

3. The system of claim 1, wherein the second feedback signal further comprises an input to a NAND gate.

4. The system of claim 1, wherein the first control circuit comprises a first comparator and a second comparator.

5. The system of claim 4, wherein an output of the S-R flip-flop comprises a control input to the first switching element.

6. The system of claim 1, wherein at least one input of the two input AND gate comprises an oscillator signal.

7. The system of claim 6, wherein the oscillator signal comprises a pulse width modulation signal.

8. The system of claim 1, wherein the boost convertor comprises an inductor, a diode, and a capacitor.

9. The system of claim 1, wherein the boost convertor is in an ON state responsive to the first switching element being in an ON state.

10. The system of claim 1, wherein the boost convertor is in an OFF state responsive to the first switching element being in an OFF state.

11. The system of claim 1, wherein the second control circuit comprises a comparator, an S-R flip-flop, an AND gate, and an amplifier.

12. The system of claim 11, wherein an output of the AND gate comprises a control input to the second switching element.

13. The system of claim 11, wherein the comparator comprises an inverting input and a non-inverting input;
   wherein an input to the inverting input comprises a reference voltage; and
   wherein an input to the non-inverting input comprises an output of the boost convertor.

14. The system of claim 1, wherein the first switching element comprises an N-type metal oxide semiconductor field effect transistor.

15. The system of claim 1, wherein the second switching element comprises an N-type metal oxide semiconductor field effect transistor.

16. A method for operating a light emitting diode (LED) driver circuit, the method comprising:
   operating a first switching element to control a boost convertor in the LED driver circuit, wherein the boost convertor is in an ON state responsive to the first switching element being in an ON state, and wherein the boost convertor outputs a step-up voltage to drive a set of LEDs, wherein the first switching element is operated by a first control circuit; and
   operating a second switching element to control the set of LEDs in the LED driver circuit, wherein the set of LEDs are in an ON state responsive to the second switching element being in an ON state, wherein the second switching element is operated by a second control circuit;
   wherein the second control circuit provides a first feedback signal and a second feedback signal to the first control circuit; and
   wherein the first feedback signal comprises a voltage value corresponding to a voltage across the set of LEDs;
   wherein the first control circuit comprises an S-R flip flop;
   wherein the second control circuit comprises a second S-R flip flop; and
   wherein a SET input of the S-R flip flop is driven by an output of a two input AND gate, wherein a first input of the two input AND gate comprises an oscillator signal, and wherein a second input of the two input AND gate comprises a complimentary output of the second S-R flip flop.

17. The method of claim 16, wherein the wherein the boost convertor is in an OFF state responsive to the first switching element being in an OFF state.

18. The method of claim 16, wherein the set of LEDs are in an OFF state responsive to the second switching element being in an OFF state.

* * * * *